(12) United States Patent
Haukka et al.

(10) Patent No.: US 8,846,502 B2
(45) Date of Patent: Sep. 30, 2014

(54) METHODS FOR DEPOSITING THIN FILMS COMPRISING GALLIUM NITRIDE BY ATOMIC LAYER DEPOSITION

(75) Inventors: Suvi Haukka, Helsinki (FI); Viljami J. Pore, Helsinki (FI); Antti Niskanen, Helsinki (FI)

(73) Assignee: ASM IP Holding B.V. (NL)

( * ) Notice: Subject to any disclaimer, the term of this patent is extended or adjusted under 35 U.S.C. 154(b) by 39 days.

(21) Appl. No.: 13/538,809

(22) Filed: Jun. 29, 2012

(65) Prior Publication Data

US 2013/0012003 A1    Jan. 10, 2013

Related U.S. Application Data

(60) Provisional application No. 61/504,985, filed on Jul. 6, 2011.

(51) Int. Cl.
*H01L 21/20* (2006.01)

(52) U.S. Cl.
USPC ............ 438/478; 438/483; 438/503; 438/761

(58) Field of Classification Search
USPC ......... 438/478, 483, 503, 507, 761, 767, 775, 438/776
See application file for complete search history.

(56) References Cited

U.S. PATENT DOCUMENTS

| | | | |
|---|---|---|---|
| 6,602,549 B1 | 8/2003 | Baum et al. | |
| 7,682,657 B2 | 3/2010 | Sherman | |
| 7,713,874 B2 | 5/2010 | Milligan | |
| 8,298,624 B2 | 10/2012 | Butcher et al. | |
| 8,450,190 B2 | 5/2013 | Cheng et al. | |
| 2007/0269965 A1 | 11/2007 | Gil et al. | |
| 2007/0281082 A1 | 12/2007 | Mokhlesi et al. | |
| 2008/0142846 A1 | 6/2008 | Kim et al. | |
| 2008/0317972 A1 | 12/2008 | Hendriks et al. | |
| 2009/0214767 A1 | 8/2009 | Wang et al. | |
| 2010/0009078 A1 | 1/2010 | Pore et al. | |
| 2010/0136313 A1 | 6/2010 | Shimizu et al. | |
| 2010/0240167 A1* | 9/2010 | Dasgupta et al. | 438/63 |
| 2011/0027977 A1 | 2/2011 | Li | |
| 2011/0104906 A1 | 5/2011 | Tois et al. | |
| 2011/0146568 A1 | 6/2011 | Haukka et al. | |
| 2011/0162580 A1 | 7/2011 | Provencher et al. | |
| 2012/0315741 A1* | 12/2012 | Su et al. | 438/478 |
| 2012/0329208 A1 | 12/2012 | Pore et al. | |

FOREIGN PATENT DOCUMENTS

WO    WO 2011/056519    5/2011

OTHER PUBLICATIONS

Ozgit et al., "Self-limiting growth of GaN using plasma-enhanced atomic layer deposition", ALD 2011, 11th International Conference on Atomic Layer Deposition, Jun. 26-29, 2011, Cambridge, MA USA (Abstract).

Adelmann et al., "Atomic-layer epitaxy of GaN quantum wells and quantum dots on (0001) AlN", Journal of Applied Physics, vol. 91, No. 8, pp. 5498-5500, Apr. 15, 2002.

(Continued)

*Primary Examiner* — Kevin M Picardat
(74) *Attorney, Agent, or Firm* — Knobbe, Martens, Olson & Bear, LLP

(57) ABSTRACT

Atomic layer deposition (ALD) processes for forming thin films comprising GaN are provided. In some embodiments, ALD processes for forming doped GaN thin films are provided. The thin films may find use, for example, in light-emitting diodes.

35 Claims, 14 Drawing Sheets

(56) References Cited

OTHER PUBLICATIONS

Adelmann et al., "Atomic Layer Epitaxy of Hexagonal and Cubic GaN Nanostructures", Phys. Status Solidi A, vol. 188, No. 2, pp. 673-676, 2001.
Boutros et al., "High quality InGaN films by atomic layer epitaxy", Appl. Phys. Lett., vol. 67, No. 13, 1856-1858, Sep. 25, 1995.
Huang et al., "Growth of wurtzite GaN on (0 0 1) GaAs substrates at low temperature by atomic layer epitaxy", Journal of Materials Science Letters, vol. 17, pp. 1281-1285, 1998.
Karam et al., "Growth of device quality GaN at 550 °C by atomic layer epitaxy", Appl. Phys. Lett., vol. 67, No. 1, pp. 94-96, Jul. 3, 1995.
Khan et al., "Atomic layer epitaxy of GaN over sapphire using switched metalorganic chemical vapor deposition", Appl. Phys. Lett., vol. 60, No. 11, pp. 1366-1368, Mar. 16, 1992.
Khan et al., "GaN/AlN digital alloy short-period superlattices by switched atomic layer metalorganic chemical vapor deposition", Appl. Phys. Lett., vol. 63, No. 25, pp. 3470-3472, Dec. 20, 1993.
Khan et al., "High-responsivity photoconductive ultraviolet sensors based on Insulating single-crystal GaN epilayers", Appl. Phys. Lett., vol. 60, No. 23, pp. 2917-2919, Jun. 8, 1992.
Kim et al., "Atomic layer deposition of GaN using $GaCl_3$ and $NH_3$", J. Vac. Sci. Technol. A, vol. 27, No. 4, pp. 923-928, Jul./Aug. 2009.
Koukitu et al., "Halogen-Transport Atomic-Layer Epitaxy of Cubic GaN Monitored by in Situ Gravimetric Method", Jpn. J. Appl. Phys., Part 1, vol. 38, pp. 4980-4982, 1999.
Kumagai et al., "In situ gravimetric monitoring of halogen transport atomic layer epitaxy of cubic-GaN", Applied Surface Science, vol. 159-160, pp. 427-431, 2000.
McIntosh et al., "Epitaxial deposition of GaInN and InN using the rotating susceptor ALE system", Applied Surface Science, vol. 112, pp. 98-101, 1997.
Piner et al., "Effect of hydrogen on the indium incorporation in InGaN epitaxial films", Appl. Phys. Lett., vol. 70, No. 4, pp. 461-463, Jan. 27, 1997.
Sumakeris et al., "Layer-by-layer epitaxial growth of GaN at low temperatures", Thin Solid Films, vol. 225, pp. 244-249, 1993.
Tsai et al., Morphological and luminescent characteristics of GaN dots deposited on AlN by alternate supply of TMG and $NH_3$, Applied Surface Science, vol. 252, pp. 3454-3459, 2006.
Tsuchiya et al., "Layer-by-Layer Growth of GaN on GaAs Substrates by Alternate Supply of $GaCl_3$ and $NH_3$ ", Jpn. J. Appl. Phys., Part 2, vol. 35, pp. L748-L750, Jun. 15, 1996.
Wang et al., "Growth and characterization of GaN films on (0001) sapphire substrates by alternate supply of trimethylgallium and $NH_3$ ", Materials Science and Engineering, vol. B57, pp. 218-223, 1999.
Leskela et al., "Atomic layer deposition (ALD): from precursors to thin film structures", Thin Solid Films 409 (2002) pp. 138-146.
Office Action dated Apr. 10, 2014 in U.S. Appl. No. 13/525,072.

* cited by examiner

METHODS FOR DEPOSITING THIN FILMS COMPRISING GALLIUM NITRIDE BY ATOMIC LAYER DEPOSITION

REFERENCE TO RELATED APPLICATIONS

The present application claims priority under 35 U.S.C. §119(e) to U.S. provisional application No. 61/504,985, filed Jul. 6, 2011, the disclosure of which is hereby incorporated by reference.

BACKGROUND OF THE INVENTION

1. Field of the Invention

The present application relates generally to methods and compounds for forming thin films comprising gallium nitride (GaN) by atomic layer deposition. Such films may find use, for example, in optoelectronic applications, such as light emitting diodes (LEDs).

2. Description of the Related Art

Currently several issues plague the manufacturing of GaN-based LEDs: poor yield of devices producing the desired wavelength and subsequent need for cumbersome device sorting, and decreasing revenue per substrate (the price ratio of LEDs producing the desired wavelength and ones with a slight deviation from this wavelength is roughly 500:1). Currently an InGaN/GaN multi-quantum well (MQW) structure in HB-LEDs is deposited by MOCVD and the deposition involves thermal cycling between approximately 700° C. and 950° C. The high temperature used limits, due to diffusion, the maximum indium concentration in the InGaN; in practice the indium concentration is limited roughly to 20 atom-% before significant diffusion of indium occurs. Additionally, in the MOCVD deposited HBLED, small variations in the deposition temperature inside the substrate area lead to minute changes in indium concentration in the InGaN layer and, subsequently, a change in the emission wavelength, leading to poor yield due to poor indium uniformity in indium content in InGaN. MOCVD also has limitations in maximum obtainable indium concentration in InGaN, limited earlier by increased mobility due to thermal cycling thermal budget, and temperature uniformity requirements.

A need exists, therefore, for methods for controllably and reliably forming thin films comprising GaN by ALD.

SUMMARY OF THE INVENTION

The methods disclosed herein provide reliable atomic layer deposition (ALD) methods for forming thin films comprising GaN. The thin films can be used, for example, in quantum well structures, LEDs and lasers. The films can be doped with In, Al, Mg, P or other dopants.

In accordance with one aspect of the present invention, atomic layer deposition (ALD) processes for forming GaN containing thin films on a substrate in a reaction chamber are provided. The processes typically comprise a plurality of deposition cycles, each cycle comprising: providing a pulse of a first vapor phase Ga reactant into the reaction chamber to form no more than about a single molecular layer of the Ga reactant on the substrate; removing excess first reactant from the reaction chamber; providing a pulse of a second vapor phase reactant comprising N to the reaction chamber such that the second vapor phase reactant reacts with the Ga reactant on the substrate to form a GaN containing thin film; and removing excess second reactant and reaction byproducts, if any, from the reaction chamber. In some embodiments the reaction chamber is part of a flow-type reactor. In some embodiments the thin film is an epitaxial or single crystal film. The growth rate of the thin film may be less than about 2 angstroms/cycle, less than about 1.5 angstroms/cycle, less than about 1 angstrom/cycle, less than about 0.5 angstrom/cycle or even less than about 0.3 angstrom/cycle depending on the reaction conditions.

In some embodiments, a thermal ALD process is used to deposit a GaN containing thin film. The Ga reactant may be a Ga halide, such as $GaCl_3$, $GaCl$ or $GaI_3$ and the second reactant may be a nitrogen containing reactant such as $NH_3$ or $N_2H_4$. The temperature of the process is preferably below about 800° C., below about 700° C., below about 600° C., below about 500° C. or below about 400° C. The reaction chamber may be part of a flow-type reactor. In some embodiments the deposited film is an epitaxial or single-crystal film.

In other embodiments, a thermal ALD process uses an organic Ga precursor, such as trimethylgallium (TMG), or triethylgallium (TEG). In some embodiments, the organic Ga precursor has the formula $GaR_3$, wherein the R is selected from the group consisting of substituted, branched, linear and cyclic C1-C10 hydrocarbons. The second reactant may be a nitrogen containing reactant such as $NH_3$ or $N_2H_4$. The temperature of the process is preferably selected such that the Ga reactant does not decompose, for example below about 400° C. or below about 300° C., depending on the particular reactant employed. The reaction chamber may be part of a flow-type reactor. In some embodiments the deposited film is an epitaxial or single-crystal film.

In other embodiments, a plasma ALD process is used to deposit a GaN containing thin film. In some such embodiments, the Ga precursor may be, for example, a Ga halide precursor, such as $GaCl_3$, $GaCl$ or $GaI_3$. The second reactant comprising N may comprise nitrogen plasma. In some embodiments the nitrogen plasma is generated in situ, for example above or directly in view of the substrate. In other embodiments the nitrogen plasma is formed remotely, for example upstream of the substrate or upstream of the reaction chamber in which the substrate is housed. In some such embodiments, the nitrogen plasma does not have a substantial amount of N ions, and is primarily N atoms. In some embodiments the second reactant also comprises hydrogen plasma. In some embodiments the second reactant is a mixture of $H_2/N_2$ plasma. In some embodiments the second reactant is a nitrogen and hydrogen containing plasma created from $H_2/N_2$ gas mixture, which preferably has an $H_2$:$N_2$ ratio above 3:1, more preferably above 4:1 and most preferably above 5:1. In some cases $H_2$:$N_2$ ratios from about 5:1 to about 10:1 can be used. The reaction temperature may be, for example, less than about 500° C., less than about 400° C., less than about 300° C. or even less than about 200° C. In some cases the reaction temperature is less than about 100° C. The process may be performed in a flow-type reactor. In some embodiments the deposited film is an epitaxial or single-crystal film.

In other plasma ALD processes an organic Ga reactant is used, such as trimethylgallium (TMG), or triethylgallium (TEG). In some embodiments, the organic Ga precursor has the formula $GaR_3$, wherein the R is selected from the group consisting of substituted, branched, linear and cyclic C1-C10 hydrocarbons. In some embodiments a Ga-halide, such as $GaCl_3$, is not used in the plasma ALD process. The second reactant comprising N may comprise nitrogen plasma. In some embodiments the nitrogen plasma is generated in situ, for example above or directly in view of the substrate. In other embodiments the nitrogen plasma is formed remotely, for example upstream of the substrate. In some such embodiments, the nitrogen plasma does not have a substantial amount of N ions, and is primarily N atoms. In some embodiments the second reactant comprises ammonia ($NH_3$) plasma. In some embodiments the second reactant also comprises hydrogen plasma. In some embodiments the second reactant is a mixture of $H_2/N_2$ plasma. In some embodiments the second reactant is a nitrogen and hydrogen containing plasma created from $H_2/N_2$ gas mixture which preferably has a $H_2:N_2$ ratio above 3:1, more preferably above 4:1 and most preferably above 5:1. In some embodiments $H_2:N_2$ ratios from about 5:1 to about 10:1 can be used. In some embodiments the second reactant is a nitrogen and hydrogen containing plasma created from $H_2/N_2$ gas mixture which preferably has a $H_2:N_2$ ratio below 3:1, more preferably below 5:2 and most preferably below 5:4. In some embodiments $H_2:N_2$ ratios from about 1:4 to about 1:2 can be used. The reaction temperature is generally chosen such that the Ga precursor does not decompose and may be, for example, less than about 400° C., less than about 300° C. or even less than about 200° C., depending on the precursor. The process may be performed in a flow-type reactor. In some embodiments the deposited film is an epitaxial or single-crystal film.

DETAILED DESCRIPTION OF THE PREFERRED EMBODIMENT

Figure 1:
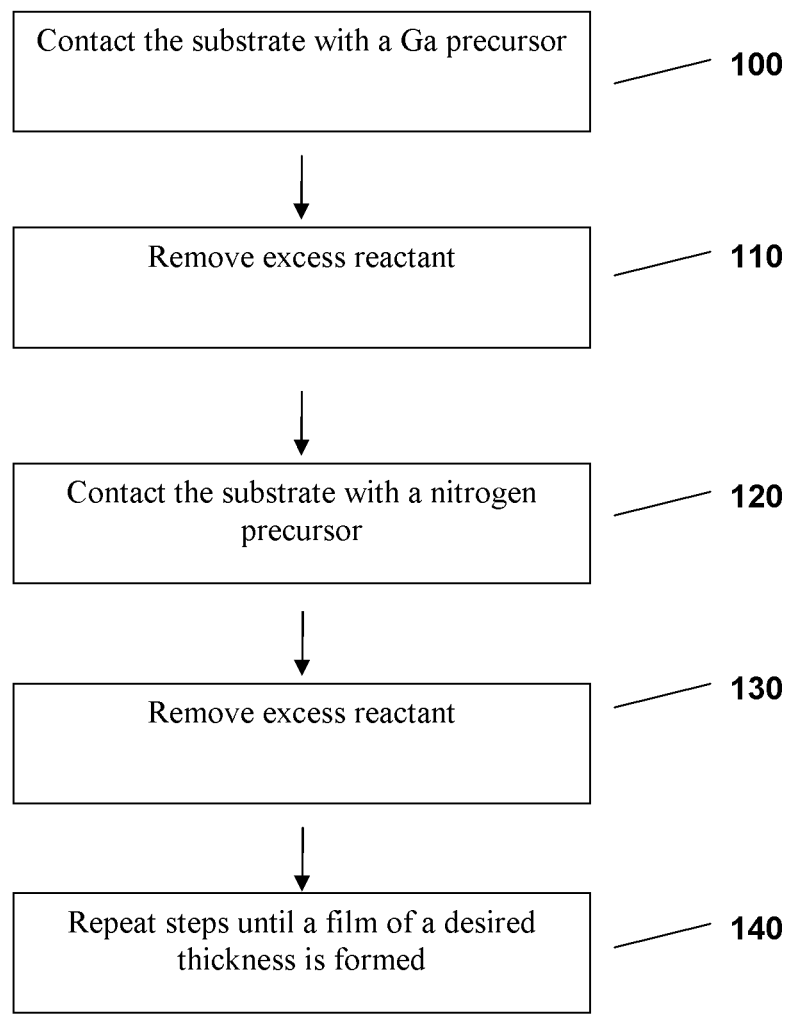
FIG. 1 is a flow chart generally illustrating a method for forming a GaN film in accordance with one embodiment.

As discussed above, GaN-containing films find use in a variety of applications, including p quantum well structures, LEDs and lasers. The films can be doped additionally with In, Al, Mg, P or other dopants.

While the embodiments of the present invention are discussed in the general context of high brightness LEDs (HB-LEDs), the skilled artisan will appreciate that the principles and advantages taught herein will have application to other devices and applications. Furthermore, while a number of processes are disclosed herein, one of ordinary skill in the art will recognize the utility of certain of the disclosed steps in the processes, even in the absence of some of the other disclosed steps, and similarly that subsequent, prior and intervening steps can be added.

GaN containing films, including those doped with In, Al, Mg, P or other dopants, such as InGaN thin films, can be deposited on a substrate by atomic layer deposition (ALD) type processes. ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant byproducts from the reaction chamber between reactant pulses. In some embodiments the GaN films are epitaxial or single-crystal films.

Briefly, a substrate is loaded into a reaction chamber and is heated to a suitable deposition temperature, generally at lowered pressure. Reactants may be provided to the reaction chamber with the aid of a carrier gas, preferably an inert carrier gas or a mixture of gases ($Ar+H_2$ for example). In some embodiments the reaction chamber is part of a flow-type reactor and during one or more reactant pulses reactant flows continuously from an inlet, over the substrate, and to a separate outlet. The outlet is typically connected to a vacuum pump and is not closed completely during the reactant pulses, thus allowing the reactant to flow continuously. In some embodiments the outlet may be partially restricted to control the flow. However, the flow will remain continuous even if the outlet is partially restricted. Continuous flow need not be maintained throughout the deposition cycle. For example, in some embodiments continuous flow is not maintained during purge steps and in some embodiments continuous flow is not maintained during provision of non-metal precursors. Thus, in some embodiments a Ga precursor is provided continuously, while a nitrogen reactant is not. Other metal reactants, such as dopants, may be provided using a continuous flow of reactant.

Examples of suitable reactors that may be used include commercially available ALD equipment such as the F-120® reactor, Pulsar® reactor and Advance® 400 Series reactor, EmerALD available from ASM America, Inc of Phoenix, Ariz. and ASM Europe B. V., Almere, Netherlands. In addition to these ALD reactors, many other kinds of reactors capable of ALD growth of thin films, including CVD reactors equipped with appropriate equipment and means for pulsing the precursors can be employed. Also batch-type ALD reactors containing multiple substrates (such as Advance® Series reactors) can be employed. Other types of reactors that can be employed include rotating or roll-to-roll reactors or reactors working at or near atmospheric pressure. Also reactors can be used where pulse separation is performed in space, rather than in time as is generally the case for ALD reactors. Such reactors may utilize, for example a movable substrate, movable precursor injection apparatus or rotating susceptor. Preferably, reactants are kept separate until reaching the reaction chamber, such that shared lines for the precursors are minimized.

The growth processes can optionally be carried out in a reactor or reaction space connected to a cluster tool. In a cluster tool, because each reaction space is dedicated to one type of process, the temperature of the reaction space in each module can be kept constant, which improves the throughput compared to a reactor in which the substrate is heated up to the process temperature before each run.

A stand-alone reactor can be equipped with a load-lock. In that case, it is not necessary to cool down the reaction space between each run.

In embodiments in which at least one of the reactants comprise a plasma reactant (a plasma-enhanced ALD or PEALD process), the plasma may be generated in situ, that is above or in direct line of sight of the substrate. In other embodiments the plasma is generated remotely, upstream of the substrate or upstream of the chamber housing the substrate during deposition.

Deposition temperatures are typically maintained below the thermal decomposition temperature of the reactants but at a high enough level to avoid condensation of reactants and to provide the activation energy for the desired surface reactions. Of course, the appropriate temperature window for any given ALD reaction will depend upon a variety of factors including the surface termination and reactant species involved. Here, the temperature varies depending on the type of film being deposited and the nature of the reactants. The temperature is preferably at or below about 800° C. for thermal ALD processes, more preferably at or below about 400° C. For processes that use plasma, the deposition temperature is preferably at or below about 400° C., more preferably at or below about 200° C. and in some cases even below about 100° C.

In some embodiments GaN is formed using a GaN deposition cycle in which a substrate is alternately and sequentially contacted with a Ga precursor and a N precursor. The GaN deposition methods can be thermal ALD processes, plasma ALD processes, or a combination of thermal and plasma processes, as discussed below. FIG. 1 is a flow chart generally illustrating a method for forming a GaN film in accordance with one embodiment. The substrate is contacted with a Ga precursor 100, such that at most a monolayer of the Ga precursor adsorbs on the substrate surface, generally in a self-limiting manner. Excess reactant (Ga precursor) is removed 110 and the substrate is contacted with a nitrogen precursor 120, which reacts with the adsorbed Ga precursor to form GaN. Excess reactant (N precursor) is removed 130 and the steps are repeated 140 until a film of the desired thickness is formed.

In some embodiments in a GaN deposition cycle a first Ga reactant is conducted or pulsed into the chamber in the form of a vapor phase pulse and contacted with the surface of the substrate. Conditions are preferably selected such that no more than about one monolayer of the first Ga reactant is adsorbed on the substrate surface in a self-limiting manner. The appropriate pulsing times can be readily determined by the skilled artisan based on the particular circumstances. In some embodiments, pulsing times are from about 0.05 to 10 seconds. In some embodiments the pulsing times are from about 0.05 s to about 1.0 s, preferably from about 0.1 s to about 0.5 s, more preferably from about 0.1 s to about 0.3 s.

In some embodiments the Ga reactant is a Ga halide, such as $GaCl_3$, GaCl or GaI3. However, in some embodiments the Ga reactant is not a Ga halide. In other embodiments the Ga reactant may be a metalorganic or organometallic Ga precursor, such as trimethylgallium (TMG) or triethylgallium (TEG). The organic Ga precursor may have the formula $GaR_3$, wherein the R is selected from substituted, branched, linear or cyclic C1-C10 hydrocarbons. In some embodiments 0-3 of the R groups are methyl and the rest are ethyl.

Excess first reactant and reaction byproducts, if any, are removed from the reaction chamber, such as by purging with an inert gas. Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as where highly conformal step coverage over extremely high aspect ratio structures or other structures with complex surface morphology is needed.

A second gaseous reactant comprising N is pulsed into the chamber where it reacts with the first Ga reactant bound to the surface. The nitrogen precursor may be, for example, $NH_3$ or $N_2H_4$. In some embodiments the second reactant does not comprise an activated compound. In some embodiments the second reactant comprises nitrogen plasma. In some embodiments the nitrogen plasma is generated remotely and comprises primarily N atoms and does not comprise a substantial amount of N ions when it reaches the substrate. In some embodiments the second gaseous reactant also comprises hydrogen plasma. In some embodiments the second reactant comprises ammonia ($NH_3$) plasma. In some embodiments the second reactant is a mixture of $H_2/N_2$ plasma. In some embodiments the second reactant is a nitrogen and hydrogen containing plasma created from a $H_2/N_2$ gas mixture which preferably has a $H_2:N_2$ ratio above 3:1, more preferably above 4:1 and most preferably above 5:1. In some embodiments $H_2:N_2$ ratios from about 5:1 to about 10:1 can be used. In some embodiments the second reactant is a nitrogen and hydrogen containing plasma created from $H_2/N_2$ gas mixture which preferably has a $H_2:N_2$ ratio below 3:1, more preferably below 5:2 and most preferably below 5:4. In some embodiments $H_2:N_2$ ratios from about 1:4 to about 1:2 can be used.

Excess second reactant and gaseous byproducts of the surface reaction, if any, are removed from the reaction chamber, preferably by purging with the aid of an inert gas and/or evacuation. The GaN deposition cycle, comprising the steps of pulsing and purging the first Ga precursor and the second N precursor, is repeated until a thin film of GaN of the desired thickness has been formed on the substrate, with each cycle leaving no more than a molecular monolayer. Additional phases comprising provision of a reactant and purging of the reaction space can be included to form more complicated materials, such as ternary materials, as described in more detail below. Additional phases can also be used in some embodiments to enhance material properties such as crystallinity.

As mentioned above, in some embodiments each pulse or phase of each cycle is self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage.

Removing excess reactants can include evacuating some of the contents of the reaction space and/or purging the reaction space with helium, nitrogen or another inert gas. In some embodiments purging can comprise turning off the flow of the reactive gas while continuing to flow an inert carrier gas to the reaction space.

The precursors employed in the ALD type processes may be solid, liquid or gaseous materials under standard conditions (room temperature and atmospheric pressure), provided that the precursors are in vapor phase before they are conducted into the reaction chamber and contacted with the substrate surface. "Pulsing" a vaporized precursor onto the substrate means that the precursor vapor is conducted into the chamber for a limited period of time. Typically, the pulsing time is from about 0.05 to 10 seconds. In some embodiments the pulsing time is from about 0.05 s to about 1.0 s, preferably from about 0.1 s to about 0.5 s, more preferably from about 0.1 s to about 0.3 s. However, depending on the substrate type and its surface area, and depending on the volume and shape of the reaction space, the pulsing time may be even higher than 10 seconds. Pulsing times can be on the order of minutes in some cases. The optimum pulsing time can be determined by the skilled artisan based on the particular circumstances.

The mass flow rate of the precursors can also be determined by the skilled artisan. In some single substrate chamber embodiments the flow rate of metal precursors is between about 1 and 1000 sccm without limitation, more preferably between about 100 and 500 sccm.

The pressure in the reaction chamber is typically from about 0.01 to about 20 mbar, more preferably from about 1 to about 10 mbar. However, in some cases the pressure will be higher or lower than this range, as can be determined by the skilled artisan given the particular circumstances. For example, during the purge step the pressure may be decreased to a level of about $10^{-6}$ mbar by pumping down the reaction space, for example with the aid of a turbo pump. In different embodiments, the pressure during the purge step may range from about $10^{-6}$ mbar to about 20 mbar.

In some embodiments in which a flow-type reactor is used, pressure in the reaction chamber may be from about 0.1 to about 10 torr, from about 0.5 to 5 torr, or, preferably, about 1 to 4 torr. In some cases a pressure around atmospheric pressure or just below atmospheric pressure may be used, for example about 700 to about 800 torr.

Before starting the deposition of the film, the substrate is typically heated to a suitable growth temperature. The growth temperature varies depending on the type of thin film formed, physical properties of the precursors, etc. The growth temperatures are discussed in greater detail below in reference to each type of thin film formed. The growth temperature can be less than the crystallization temperature for the deposited materials such that an amorphous thin film is formed or it can be above the crystallization temperature such that a crystalline thin film is formed. The preferred deposition temperature may vary depending on a number of factors such as, and without limitation, the reactant precursors, the pressure, flow rate, the arrangement of the reactor, crystallization temperature of the deposited thin film, and the composition of the substrate including the nature of the material on which deposition is to take place. The specific growth temperature may be selected by the skilled artisan.

Although the Ga reactant is referred to as the first reactant and the N containing reactant is referred to as the second reactant in the description above, the skilled artisan will recognize that in some situations the N containing reactant may be provided first.

In some embodiments, the reactants and reaction by-products can be removed from the reaction chamber by stopping the flow of the Ga or N precursor (or other precursor) while continuing the flow of an inert carrier gas such as nitrogen or argon.

The growth rate of the GaN containing thin films is generally less than about 2 angstroms per cycle, and may be less than 1.5 angstroms/cycle, less than about 1 angstrom/cycle, less than about 0.5 angstrom/cycle or even less than about 0.3 angstrom/cycle in some cases.

As mentioned above, additional phases comprising provision of one or more additional reactants can be included to form more complicated materials, such as ternary materials. In some embodiments the GaN containing thin film may be doped with one or more additional materials such as In, Al, Mg or P. In some embodiments, a third reactant (or dopant precursor) comprising one or more of these materials is provided at least once during each GaN deposition cycle. For example, a dopant precursor, such as an indium precursor, may be provided in one or more of the GaN deposition cycles. In some embodiments the indium precursor (or other dopant precursor) may replace the gallium precursor in one or more deposition cycles. In other embodiments, a dopant precursor, such as an indium precursor, is provided in addition to the gallium precursor in one or more deposition cycles. In some embodiments the dopant precursor may be provided together with the Ga precursor. In other embodiments the dopant precursor may be provided separately to the reaction space from the Ga precursor. The dopant precursor, such as an indium precursor, may be provided before or after the gallium precursor (e.g. 100 in FIG. 1) and/or before or after the nitrogen precursor (e.g. 120 in FIG. 1). Similarly, Al, Mg or P precursors may be provided to obtain the desired composition or desired properties.

In some embodiments one or more full deposition cycles of a dopant material, such as a metal nitride, are provided at a desired ratio with deposition cycles of the bulk material, typically GaN. However, in some embodiments, as mentioned above, instead of a full deposition cycle of a dopant material between the bulk material (i.e. GaN) deposition cycles, single dopant pulses are provided in combination with Ga precursor pulses in a dopant deposition cycle. For example: if a very thin layer of GaN is to be deposited or a very low dopant concentration is desired, the deposition of the binary material is divided into two types of cycles: bulk deposition cycles for deposition of GaN and dopant deposition cycles. During the bulk deposition of GaN, only the binary material deposition cycles (GaN deposition cycles) are used. As described above, these typically involve alternating and sequential pulses of a Ga precursor and a N reactant. For the dopant deposition cycles, modified cycles are used, where a dopant pulse and purge is introduced either before or after the Ga precursor pulse. In some embodiments the dopant precursor may be provided with the Ga precursor. This leads to a different, but small, amount of dopant in the film due to the limited number of available surface adsorption sites for the Ga and dopant precursors. In some embodiments a single pulse of a non-metallic reactant, typically a reactant comprising N, is used to convert the Ga precursor and dopant to the desired film, such as doped GaN. In some embodiments the non-metallic reactant may be comprise hydrogen (molecules, plasma, radicals or atoms).

An exemplary dopant cycle may comprise, for example, pulsing the Ga precursor, purging the reaction space, pulsing the dopant precursor, purging the reaction space, pulsing the N reactant, and purging the reaction space. A different dopant deposition cycle may comprise pulsing the dopant precursor, purging the reaction space, pulsing the Ga precursor, purging the reaction space, pulsing a N reactant and purging the reaction space. The dopant deposition cycle may be repeated one or more times, and may be followed by one or more bulk GaN deposition cycles.

In some embodiments, for example, an indium precursor may be provided before, after or with the gallium precursor. The same type of reactive sites that the Ga precursor compound, such as $GaCl_3$, reacts with can also be reacted with an indium compound (or other dopant precursor), for example an alkylindium compound such as TMI, which would result after treatment with the N containing reactant, in a GaN film doped with a small, but controlled and uniform amount of In as a dopant. In some embodiments, alkylgallium and alkylindium compounds, such as trimethylgallium (TMG) and trimethylindium (TMI) are provided, as they are able to utilize more types of reactive sites than many other chemicals. An exemplary In doped GaN deposition process is provided in Example 9, below.

In some embodiments, a GaN film doped with Mg is deposited. GaN:Mg can, for example, be deposited from $GaI_3$ and $NH_3$, with $MgCp_2$ used for doping. The GaN (bulk) deposition cycle may comprise a $GaI_3$ pulse, a purge, an $NH_3$ pulse, and a second purge. The dopant deposition cycle may comprise a $GaI_3$ pulse, a first purge, a $MgCp_2$ pulse, a second purge, a $NH_3$ pulse, and a third purge. The dopant deposition cycle may be followed by bulk deposition. In other embodiments, the dopant deposition cycle may comprise a $MgCp_2$ pulse, a first purge, a $GaI_3$ pulse, a second purge, a $NH_3$ pulse, and a third purge. The dopant deposition cycle may be followed by bulk deposition of GaN. Example 10, below, provides an exemplary GaN:Mg deposition process. The skilled artisan will recognize that other dopants can be substituted for Mg in these embodiments.

In some embodiments, one or more different deposition cycles may be provided at a selected ratio with GaN depositon cycles to form a thin film with the desired composition. For example, a separate deposition cycle for forming a metal nitride such as InN, MgN, AlN, or other type of film, may be used. In some embodiments, for example, an InN deposition cycle is used in conjunction with a GaN deposition cycle to form an InGaN film. The InN deposition cycle is carried out at a desired ratio to the GaN deposition cycle in order to obtain the desired InGaN film. The indium content (or other dopant content) can be expressed as a percentage of the overall metal content in the film, e.g. In/(In+Ga). In some embodiments the dopant content, for example the In/(In+Ga) ratio, in the deposited film is about 0-20% and preferably about 0-50%. In some embodiments the dopant content, for example the In/(In+Ga) ratio, in the deposited film is up to about 100%. In other embodiments a separate AlN deposition cycle may be used in conjunction with the GaN deposition cycle in order to obtain a desired AlGaN film. Since growth is by ALD and therefore generally self-limited and independent of small temperature variations, a uniform amount of dopant, for example In or Al or Mg, across the substrate surface is obtained. The ratio of GaN deposition cycles to other metal nitride deposition cycles (or other dopant deposition cycles) can be selected such that a desired composition is achieved. In some embodiments the ratio of GaN deposition cycles to GaN deposition cycles plus dopant deposition cycles is less than about 0.5. In some embodiments the ratio of GaN deposition cycles to dopant deposition cycles plus GaN deposition cycles is less than about 0.4, preferably less than about 0.3, more preferably less than about 0.2, and in some cases less than about 0.1. In some embodiments multiple cycles of GaN deposition are performed along with multiple cycles of another deposition cycle to form a nanolaminate film of GaN and another material.

An InN deposition cycle can be used in some embodiments in combination with a GaN deposition cycle to deposit InGaN. The InN deposition cycle can be similar to the GaN deposition cycle, such that the substrate is alternately and sequentially contacted with an In precursor and a N precursor. Thus, in some embodiments an InN deposition cycle comprises providing a first indium precursor into the reaction chamber in the form of a vapor phase pulse such that it contacts the surface of the substrate. Conditions are preferably selected such that no more than about one monolayer of the first In reactant is adsorbed on the substrate surface in a self-limiting manner. The appropriate pulsing times can be readily determined by the skilled artisan based on the particular circumstances. In some embodiments, pulsing times are from about 0.05 to 10 seconds. Example 7 describes deposition of an InN film by ALD.

In some embodiments the In reactant is an In halide, such as $InCl_3$ or $InI_3$. In other embodiments the In reactant may be an (metal)organic or organometallic In precursor, such as cyclopentadienylindium (InCp), dimethylethylindium (DMEI), trimethylindium (TMI) or triethylindium (TEI). In some embodiments the organic In precursor may have the formula $InR_3$, wherein the R is selected from substituted, branched, linear or cyclic C1-C10 hydrocarbons. In some embodiments 0-3 of the R groups are methyl and the rest are ethyl. In some embodiments, the In precursors has both a halide ligand and organic ligand, for example $InR_xX_{3-x}$, wherein x is from 1 to 2 and R is organic ligand, such as alkyl or alkenyl and X is halide, such as chloride. Examples of this kind of In precursors might be, for example, dimethylindiumchloride $(CH_3)_2InCl$. The precursors can be used in both thermal and plasma ALD processes for forming InN.

Excess first reactant and reaction byproducts, if any, are removed from the reaction chamber, such as by purging with an inert gas and a second gaseous reactant comprising N is pulsed into the chamber where it reacts with the first In reactant bound to the surface. The nitrogen precursor may be, for example, $NH_3$ or $N_2H_4$. In some embodiments the N precursor comprises nitrogen plasma. In some embodiments the second reactant also comprises hydrogen plasma. In some embodiments the second reactant is a mixture of $H_2/N_2$ plasma. In some embodiments the second reactant is a nitrogen and hydrogen containing plasma created from $H_2/N_2$ gas mixture which preferably has a $H_2:N_2$ ratio above 3:1, more preferably above 4:1 and most preferably above 5:1. In some embodiments $H_2:N_2$ ratios from about 5:1 to about 10:1 can be used. In some embodiments $H_2:N_2$ ratios from about 5:1 to about 10:1 can be used. In some embodiments the second reactant is a nitrogen and hydrogen containing plasma created from $H_2/N_2$ gas mixture which preferably has a $H_2:N_2$ ratio below 3:1, more preferably below 5:2 and most preferably below 5:4. In some embodiments $H_2:N_2$ ratios from about 1:4 to about 1:2 can be used.

Excess second reactant and gaseous byproducts of the surface reaction, if any, are removed from the reaction chamber, preferably by purging with the aid of an inert gas and/or evacuation. The InN deposition cycle, comprising the steps of pulsing and purging the first In precursor and the second N precursor, is repeated until a thin film of InN of the desired thickness has been formed on the substrate, with each cycle leaving no more than a molecular monolayer. The InN and the GaN deposition cycle are repeated at an appropriate ratio to produce an InGaN film with the desired composition. For example, to achieve an In concentration of about 20-at %, 12 cycles of GaN can be mixed with three cycles of InN deposition. Sets of 12 cycles of GaN and three cycles of InN can be repeated until a film of a desired thickness is formed. In some embodiments, an InGaN film comprising greater than about 30-at % In is deposited. Since growth is by ALD and therefore self-limited and independent of small temperature variations, a uniform amount of doping across the substrate is obtained.

Similarly, in other embodiments an AlN deposition cycle and a GaN deposition cycles are provided at an appropriate ratio to form a desired AlGaN film. An AlN deposition cycle is similar to the GaN and InN deposition cycles described above. Thus, in some embodiments an AlN deposition cycle comprises providing a first aluminum precursor into the reaction chamber in the form of a vapor phase pulse such that it contacts the surface of the substrate. Conditions are preferably selected such that no more than about one monolayer of the first Al reactant is adsorbed on the substrate surface in a self-limiting manner. The appropriate pulsing times can be readily determined by the skilled artisan based on the particular circumstances. In some embodiments, pulsing times are from about 0.05 to 10 seconds. Example 8 provides an example of an AlN deposition cycle that may be used in some embodiments. In some embodiments, AlN is deposited at a reaction temperature of less than about 120° C., less than about 100° C. or even less than about 50° C. In some embodiments AlN is deposited at room temperature, i.e. from about 20° C. to about 25° C. In some embodiments AlN is deposited separately from other materials, such as in a separate reaction space.

In some embodiments the Al reactant is an Al halide, such as $AlCl_3$ or $AlI_3$. In other embodiments the Al reactant may be an organic Al precursor, such as trimethylaluminum (TMA). The organic Al precursor may have the formula $AlR_3$, wherein the R is selected from substituted, branched, linear or cyclic C1-C10 hydrocarbons. In some embodiments 0-3 of the R groups are methyl and the rest are ethyl. In some embodiments, the Al precursors has both a halide ligand and organic ligand, for example $AlR_xX_{3-x}$, wherein x is from 1 to 2 and R is organic ligand, such as alkyl or alkenyl and X is halide, such as chloride. Examples of this kind of In precursors might be, for example, dimethylaluminumchloride $(CH_3)_2AlCl$.

Excess first reactant and reaction byproducts, if any, are removed from the reaction chamber, such as by purging with an inert gas and a second gaseous reactant comprising N is pulsed into the chamber where it reacts with the first In reactant bound to the surface. The nitrogen precursor may be, for example, $NH_3$ or $N_2H_4$. In some embodiments the N precursor comprises nitrogen plasma, ions, radicals or atoms.

Excess second reactant and gaseous byproducts of the surface reaction, if any, are removed from the reaction chamber, preferably by purging with the aid of an inert gas and/or evacuation. The AlN deposition cycle, comprising the steps of pulsing and purging the first Al precursor and the second N precursor, is repeated until a thin film of AlN of the desired thickness has been formed on the substrate, with each cycle leaving no more than a molecular monolayer. The AlN and the GaN deposition cycle are repeated at an appropriate ratio to produce an AlGaN film with the desired composition.

In other embodiments, a single Ga, In or Al reactant is used in an ALD process, where the single reactant comprises nitrogen and Ga, In or Al. In some embodiments plasma can be used with the single reactant, such as hydrogen plasma, plasma generated from a mixture of hydrogen and nitrogen, and $NH_3$ plasma. Also hydrogen and/or nitrogen containing radicals, atoms or ions can be used. Alternate and sequential pulses of the metal reactant and the plasma reactant may be provided to form a thin metal nitride film. For example, in some embodiments a GaN deposition cycle may comprise providing a Ga reactant comprising nitrogen in a first pulse, purging the reaction chamber, providing a plasma reactant that converts the Ga reactant into GaN, and purging the reaction chamber. The cycle may be repeated to form a GaN film of the desired thickness.

In some embodiments, each deposition cycle includes a further plasma processing step in which the substrate is contacted with a plasma to further facilitate film crystallization by increasing surface mobility with the heat generated by radical recombination on the surface. In other embodiments, a further plasma processing step is provided once a thin film of a desired thickness has been deposited, or at intervals during the deposition process. In some embodiments the plasma is provided in each cycle. In other embodiments the plasma is provided once every 10 to 20 cycles and is generated from nitrogen and/or hydrogen.

Thermal Atomic Layer Deposition of GaN

In some embodiments, no plasma or activated species are used in the GaN ALD cycles. In some embodiments thermal ALD cycles for depositing GaN can be used in combination with plasma ALD cycles for depositing an additional material, such as a dopant, for example a metal nitride. For example, thermal GaN ALD cycles may be used in combination with plasma InN ALD deposition cycles to form an InGaN film. In some embodiments thermal GaN ALD cycles are used in combination with thermal dopant ALD cycles, and no activated species are used in the deposition process.

In some embodiments, an evaporation temperature for the Ga reactant may be from about 180° C. to about 220° C. The deposition temperature of the process is preferably selected such that the Ga reactant does not decompose, for example below about 800° C., below about 700° C., below about 600° C., below about 550° C., below about 500° C., below about 450° C., or below about 400° C., depending on the particular reactant employed. The reaction chamber may be part of a flow-type reactor. In some embodiments the deposited film is an epitaxial or single-crystal film.

In some embodiments the Ga precursor is a Ga halide, such as $GaCl_3$. GaCl, or $GaI_3$ and the second reactant may be a nitrogen containing reactant such as $NH_3$ or $N_2H_4$. The temperature of the process is preferably below about 800° C., below about 700° C., below about 600° C., below about 500° C. or below about 400° C.

In other embodiments, a thermal ALD process uses an organic Ga precursor, such as trimethylgallium (TMG), or triethylgallium (TEG). In some embodiments, the organic Ga precursor has the formula $GaR_3$, wherein the R is selected from the group consisting of substituted, branched, linear and cyclic C1-C10 hydrocarbons. In some embodiments reactants are evaporated at room temperature.

The second reactant may be a nitrogen containing reactant such as $NH_3$ or $N_2H_4$.

The reaction chamber may be part of a flow-type reactor. In some embodiments the deposited film is an epitaxial or single-crystal film.

Plasma Enhanced Atomic Layer Deposition of GaN

In other embodiments, a plasma ALD process is used to deposit a GaN containing thin film. In some such embodiments, the Ga precursor may be, for example, a Ga halide precursor, such as $GaCl_3$, GaCl or $GaI_3$. The evaporation temperature for the Ga reactant may be from about 180° C. to about 220° C. in some embodiments. The second reactant comprising N may be a nitrogen plasma containing precursor. In some embodiments the nitrogen plasma is generated in situ, for example above or directly in view of the substrate. In other embodiments the nitrogen plasma is formed remotely, for example upstream of the substrate. In some such embodiments, the nitrogen plasma does not have a substantial amount of N ions, and is primarily N atoms. In some embodiments the second reactant also comprises hydrogen plasma. In some embodiments the second reactant is a mixture of $H_2/N_2$ plasma. In some embodiments the second reactant is a nitrogen and hydrogen containing plasma created from a $H_2/N_2$ gas mixture which preferably has a $H_2:N_2$ ratio above 3:1, more preferably above 4:1 and most preferably above 5:1. In some embodiments $H_2/N_2$ ratios from about 5:1 to about 10:1 can be used. In some embodiments the ratio of hydrogen to nitrogen can be selected to deposit a film having desired properties, such as density, roughness, crystallinity, and composition. The reaction temperature may be, for example, less than about 500° C., less than about 400° C., less than about 300° C. or even less than about 200° C. The process may be performed in a flow-type reactor. In some embodiments the deposited film is an epitaxial or single-crystal film.

In other plasma ALD processes an organic Ga reactant is used, such as trimethylgallium (TMG), or triethylgallium (TEG). In some embodiments, the organic Ga precursor has the formula $GaR_3$, wherein the R is selected from the group consisting of substituted, branched, linear and cyclic C1-C10 hydrocarbons. The Ga precursor may be evaporated at room temperature. The second reactant comprising N may be a nitrogen plasma containing precursor. In some embodiments the nitrogen plasma is generated in situ, for example above or directly in view of the substrate. In other embodiments the nitrogen plasma is formed remotely, for example upstream of the substrate. In some such embodiments, the nitrogen plasma does not have a substantial amount of N ions, and is primarily N atoms. In some embodiments the second reactant also comprises hydrogen plasma. In some embodiments the second reactant is a mixture of $H_2/N_2$ plasma. The reaction temperature is generally chosen such that the Ga precursor does not decompose and may be, for example, less than about 400° C., less than about 300° C. or even less than about 200° C., depending on the precursor. The process may be performed in a flow-type reactor. In some embodiments the deposited film is an epitaxial or single-crystal film.

In some embodiments the plasma power can be varied. Preferably the plasma power supplied is about 100 W or more. In some embodiments the plasma power is greater than about 200 W, preferably greater than about 300 W, more preferably greater than about 400 W, and in some cases above about 500 W or 600 W. In some embodiments the plasma parameters can be selected to achieve desired properties in the deposited film, such as the film thickness, roughness, and density.

In some embodiments the reaction conditions can be selected to deposit a film with a desired density. In some embodiments the density is greater than about 3 $g/cm^3$. In some embodiments the density is greater than about 4.5 $g/cm^3$. In some embodiments the density of the deposited film is greater than about 5 $g/cm^3$. In some embodiments the density of the deposited film is greater than about 5.5 $g/cm^3$ In some embodiments the reaction conditions can be selected to deposit a film with a desired roughness or smoothness. In some embodiments the roughness is less than about 4 nm. In some embodiments the roughness is less than about 3 nm. In some embodiments the roughness of the deposited film is preferably less than about 2 nm. In some embodiments the roughness of the deposited film is preferably less than about 1.5 nm.

In some embodiments, plasma GaN ALD cycles can be used in conjunction with thermal ALD cycles for depositing another material, such as a different metal nitride.

Example 1

InGaN thin films were deposited using 1000 deposition cycles. A mixture of both InN and GaN deposition cycles were used. The ratio between the InN and GaN deposition cycles was varied. The substrate temperature was 200° C. during the film deposition.

TEG and a mixture of hydrogen/nitrogen plasma were used for the GaN deposition cycles. A 1.0 s pulse length was used for TEG, followed by a 2.0 s purge. A 2.0 s pulse length was used for the plasma step followed by a 1.0 s purge step.

For the InN deposition cycles, TMI and a mixture of hydrogen/nitrogen plasma were used as the reactants. A 1.0 s pulse length was used for TMI followed by a 2.0 s purge after TMI. The purge was followed by a 2.0 s plasma step and 1.0 s purge step. The plasma reactant was a mixture of hydrogen/nitrogen plasma.

The plasma power supplied was 400 W. Nitrogen and hydrogen flows used for plasma steps were 40 and 50 sccm, respectively.

Figure 2A:
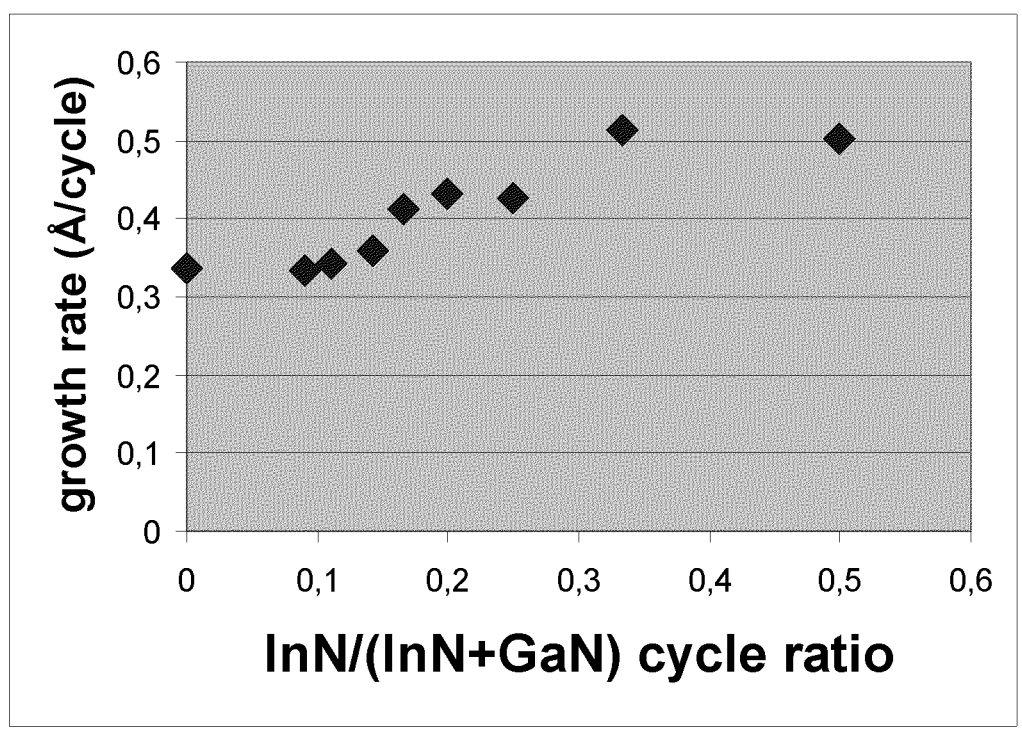
FIG. 2A is a graph showing the growth rate versus InN/(InN+GaN) cycle ratio in accordance with one embodiment.

FIG. 2A shows the growth rate for the deposited films for various InN/(InN+GaN) ratios. The growth rate was between about 0.3 and 0.5 Å per cycle.

Figure 2B:
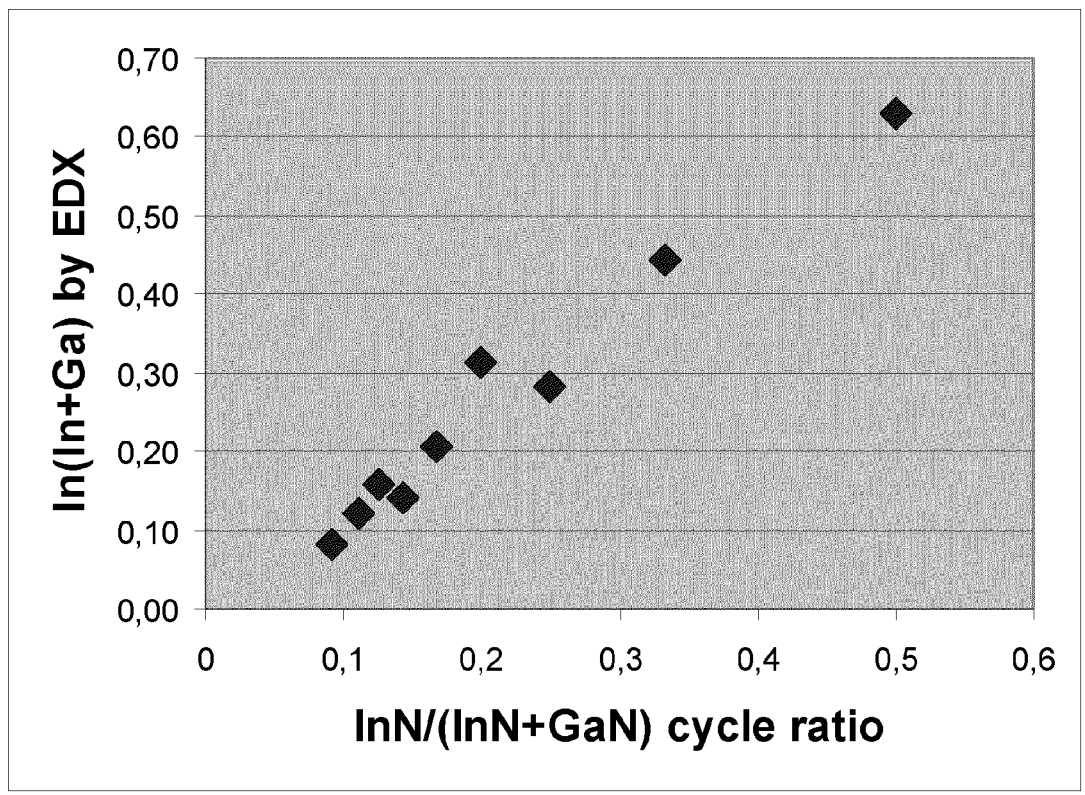
FIG. 2B is a graph showing In/(In+Ga) ratio versus InN/(InN+GaN) cycle ratio in accordance with one embodiment.

FIG. 2B shows the In/(In+Ga) content as measured by EDX for the deposited films for various InN/(InN+GaN) ratios. The indium content in the films increased with an increased InN/(InN+GaN) ratio.

Example 2

Figure 3A:
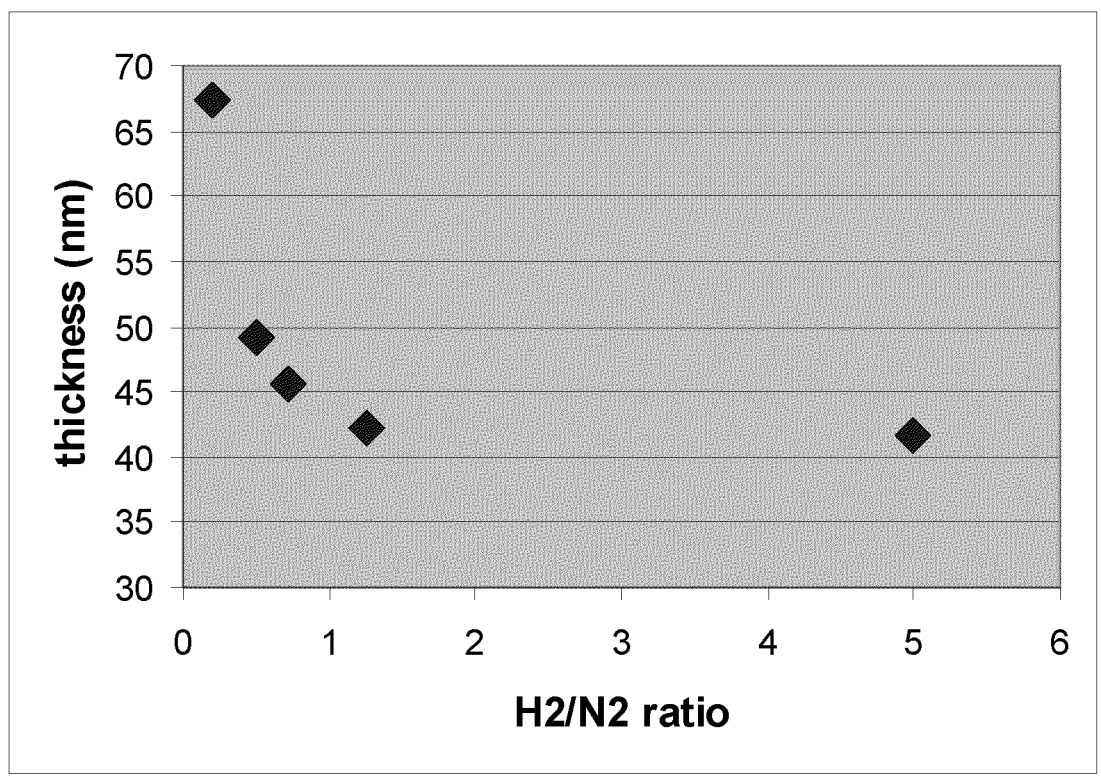
FIG. 3A is a graph showing the thickness of deposited InGaN films versus hydrogen/nitrogen ratio in accordance with one embodiment.
Figure 3B:
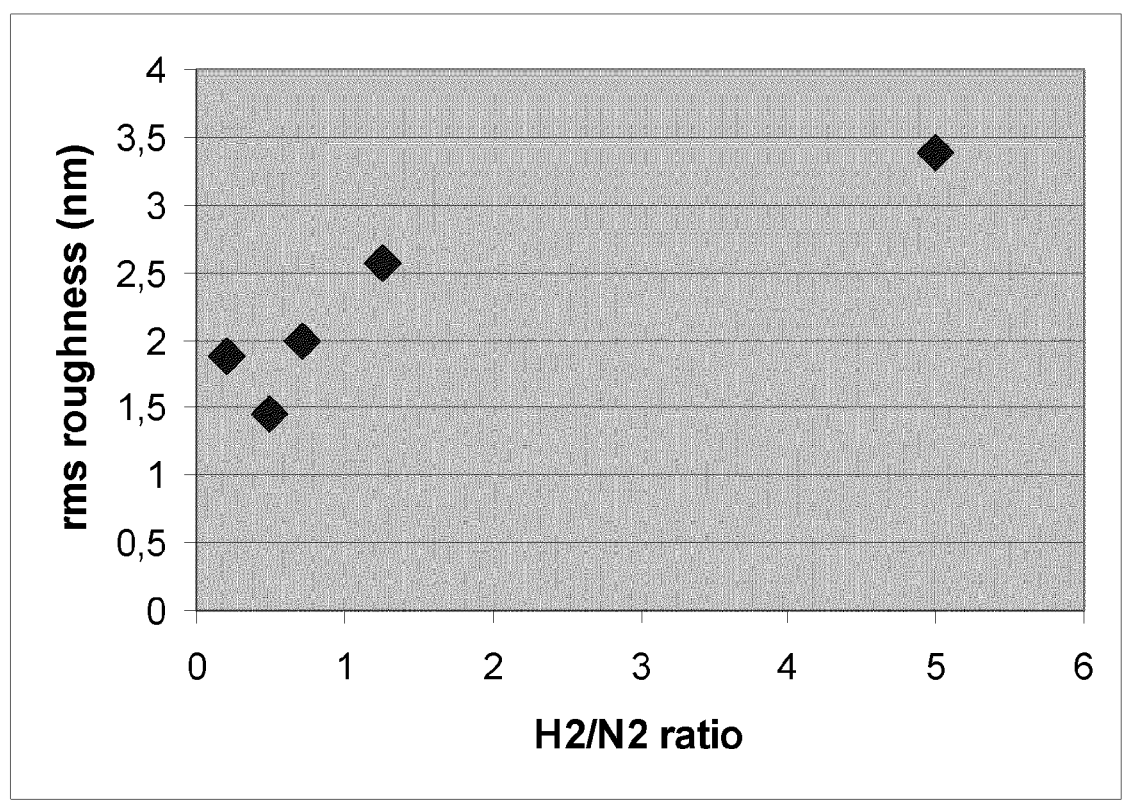
FIG. 3B is a graph showing the roughness of deposited InGaN films versus hydrogen/nitrogen ratio in accordance with one embodiment.
Figure 3C:
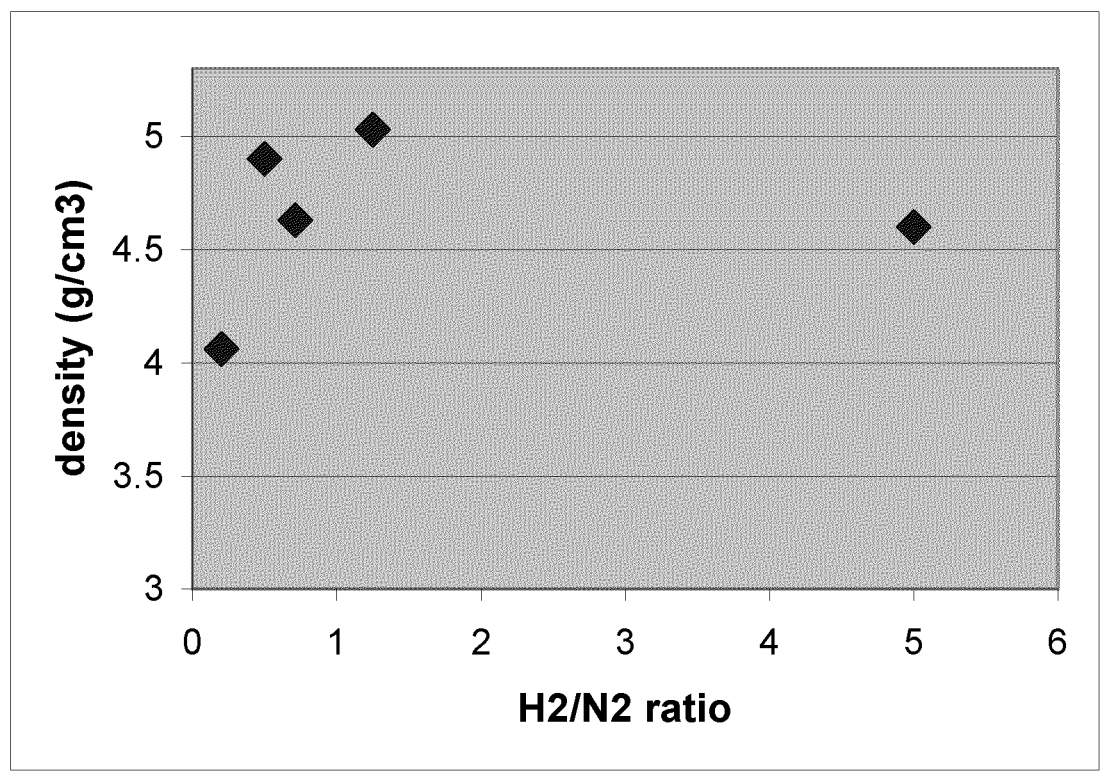
FIG. 3C is a graph showing the density of deposited InGaN films versus hydrogen/nitrogen ratio in accordance with one embodiment.

InGaN films were deposited with various hydrogen:nitrogen ratios. The InGaN thin films were deposited using 1000 deposition cycles. InN and GaN deposition cycles were used. The substrate temperature was 200° C. during the film deposition. TMG and a mixture of hydrogen/nitrogen plasma were used for the GaN deposition cycles, with a 0.5 s pulse length for TMG, followed by a 2.0 s purge after TMG, a 2.0 s plasma step and a subsequent 1.0 s purge step. TMI and a mixture of hydrogen/nitrogen plasma were used for the InN deposition cycles with a 1.0 s pulse length for TMI and 2.0 s purge after the TMI pulse and a 2.0 s plasma step and 1.0 s purge after the plasma step. The plasma power supplied was 400 W. The ratio between the hydrogen and nitrogen gases was varied. FIGS. 3A-3C illustrate the thickness, roughness, and density for the deposited InGaN films. FIG. 3A shows that the thickness of the deposited film decreased as the hydrogen:nitrogen ratio increased. FIG. 3B shows that the roughness of the deposited film increased as the hydrogen:nitrogen ratio was increased. FIG. 3C shows that the highest film density was achieved using a hydrogen:nitrogen ratio of about 1.

Example 3

Figure 4A:
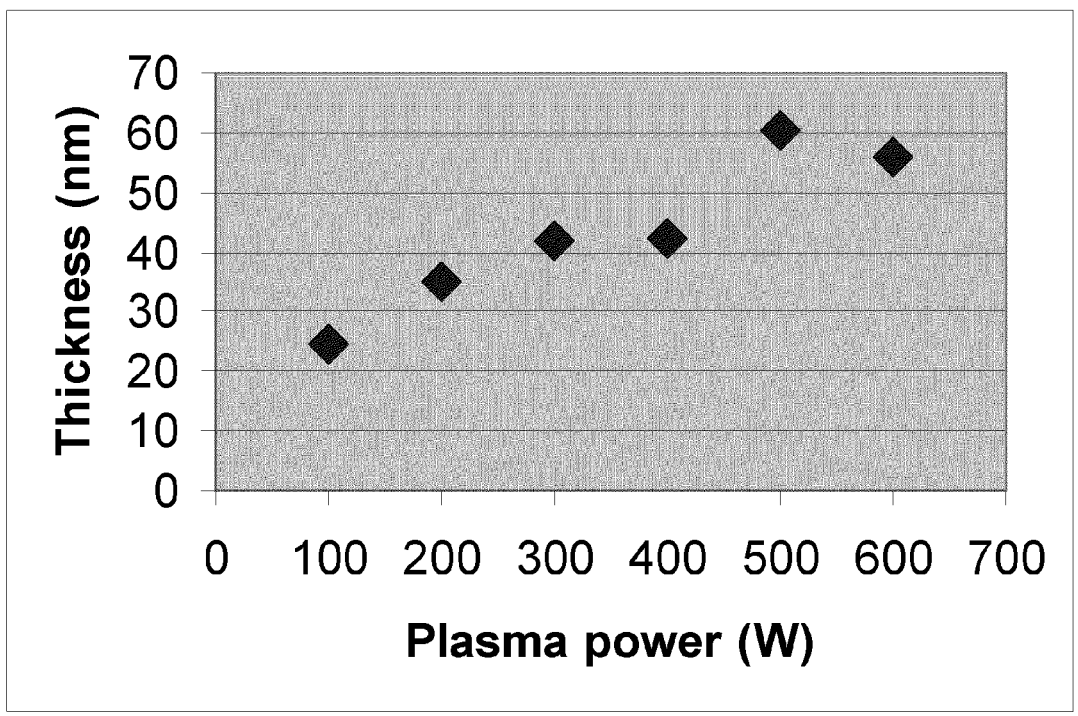
FIG. 4A is a graph showing the thickness of deposited InGaN films versus plasma power in accordance with one embodiment.
Figure 4B:
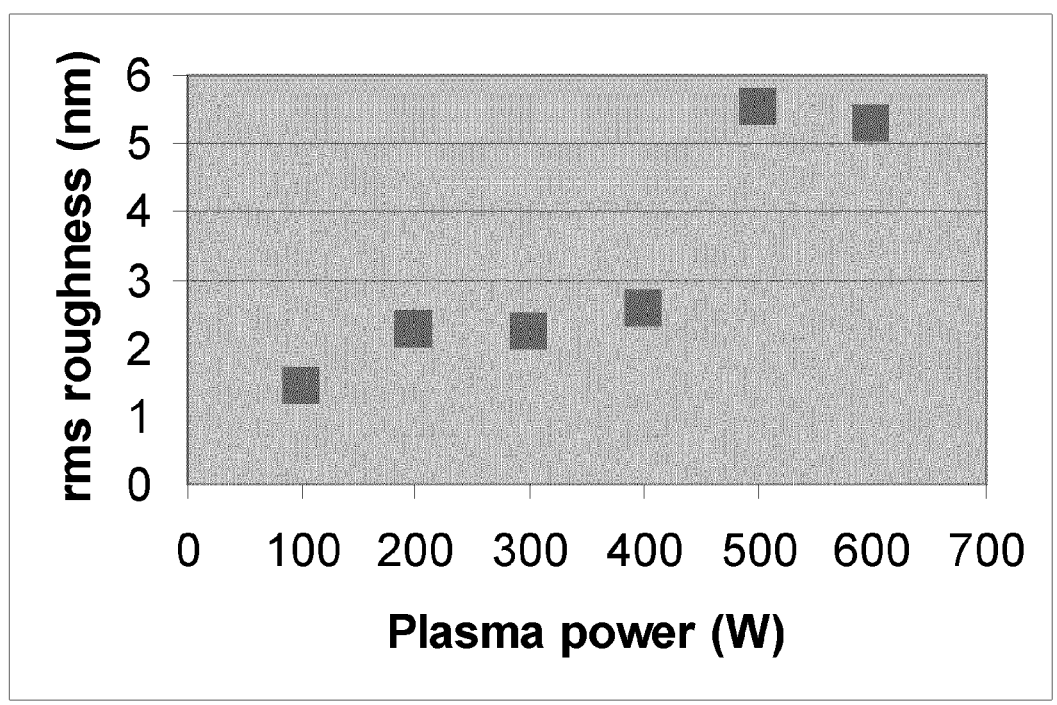
FIG. 4B is a graph showing the roughness of deposited InGaN films versus plasma power in accordance with one embodiment.
Figure 4C:
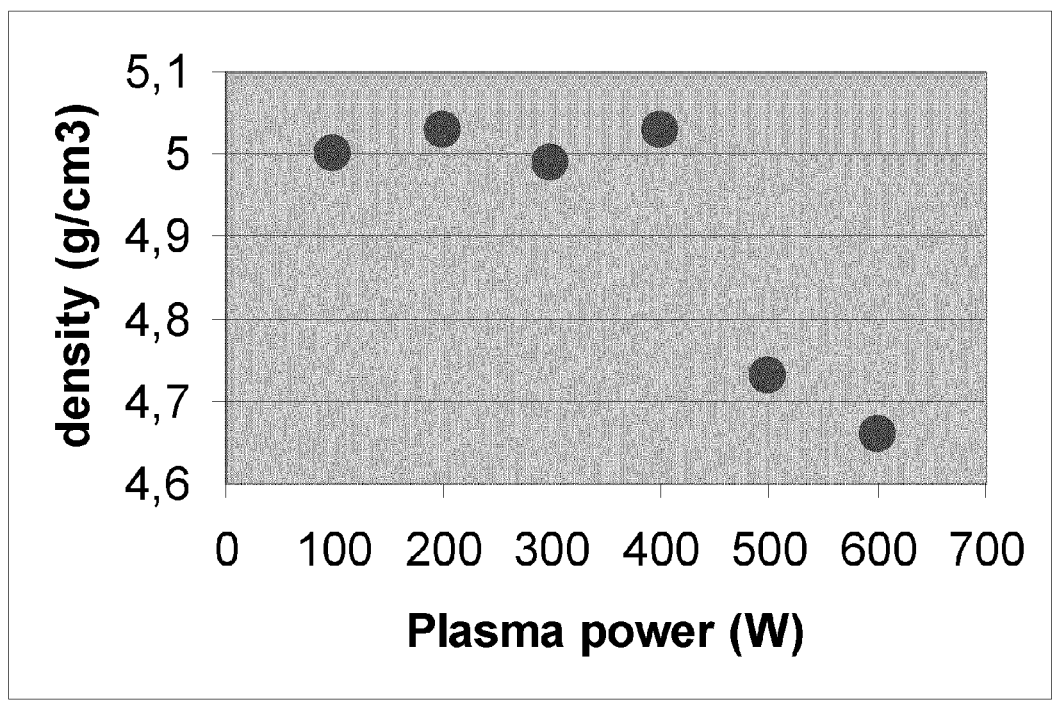
FIG. 4C is a graph showing the density of deposited InGaN films versus plasma power in accordance with one embodiment.

InGaN thin films were deposited, using the precursors as in Example 2. 1000 deposition cycles were carried out while varying the plasma power. Nitrogen and hydrogen flows used for the plasma steps were 40 and 50 sccm, respectively. FIGS. 4A-4C illustrate the thickness, roughness, and density for the deposited InGaN films. FIG. 4A shows that the thickness of the deposited film increased as the plasma power increased. FIG. 4B shows that the roughness of the deposited film increased as the plasma power increased. FIG. 4C shows that the density of the deposited film decreased with a plasma power of about 500 W or greater.

Example 4

Figure 5:
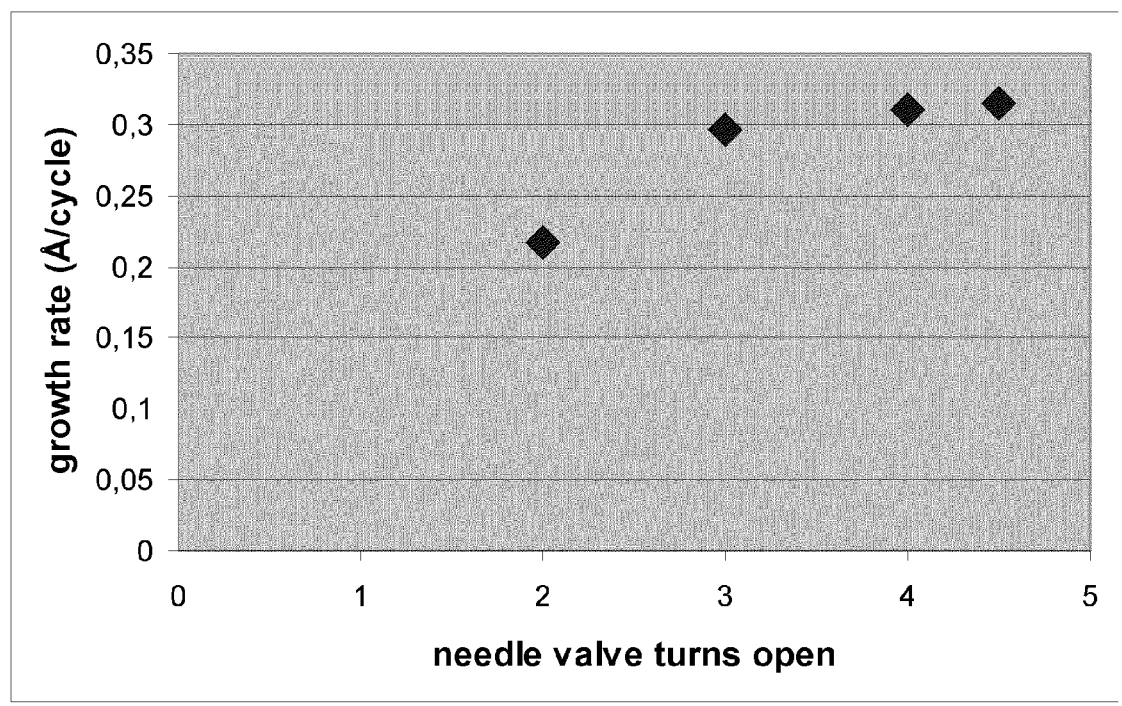
FIG. 5 is a graph showing the growth rate per cycle versus gallium reactant supply as represented by turns of the valve supplying the gallium reactant in accordance with one embodiment.

FIG. 5 shows the growth rate while varying the supply of gallium reactant to the reaction space. Reaction conditions were as described in Example 2 for the GaN cycle, except that the supply of the Ga reactant was varied. Nitrogen and hydrogen flows used for plasma steps were 40 and 50 sccm, respectively. The supply of gallium reactant was varied by turning the needle valve that controlled the flow of reactant. The growth of GaN saturated after about 4 turns of the needle valve, thus illustrating that growth rate increases with increasing flow rate of gallium reactant up to a point, beyond which saturation occurs in each cycle.

Example 5

Figure 6A:
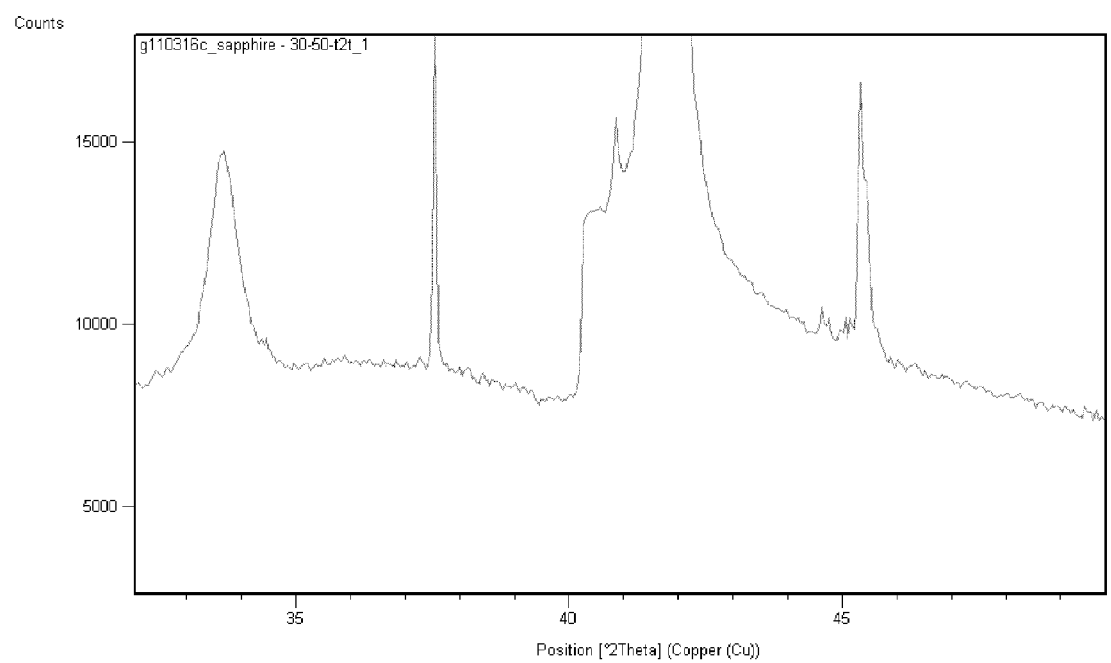
FIG. 6A is a glancing incidence x-ray diffraction (GIXRD) graph of a InGaN film deposited on sapphire in accordance with one embodiment.
Figure 6B:
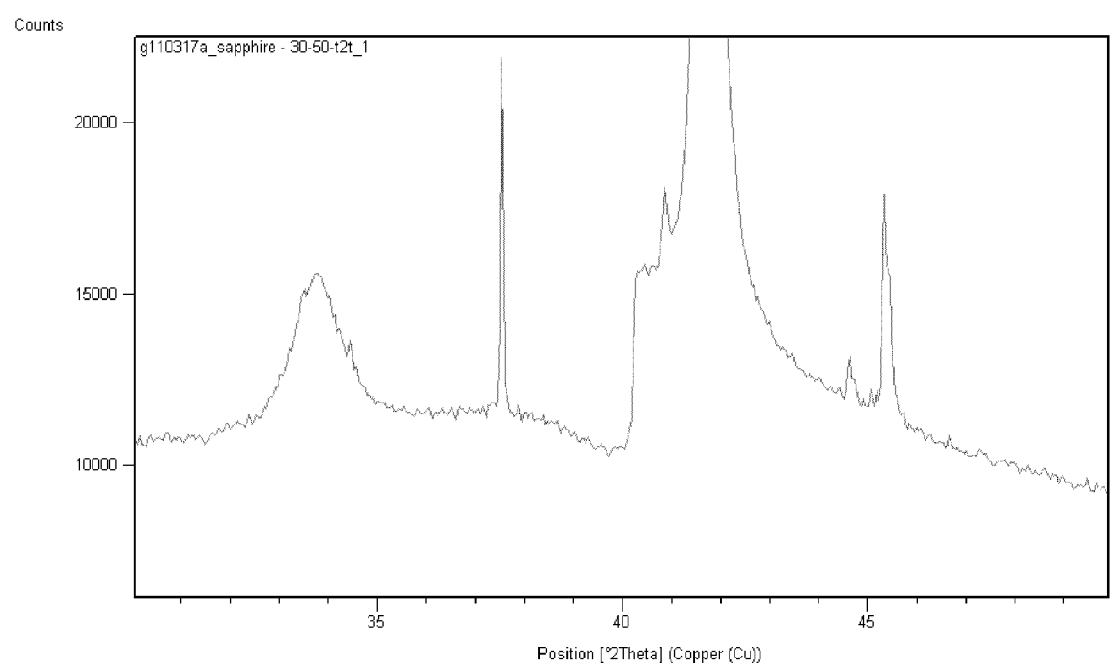
FIG. 6B is a glancing incidence x-ray diffraction (GIXRD) graph of a GaN film deposited on sapphire in accordance with one embodiment.
Figure 6C:
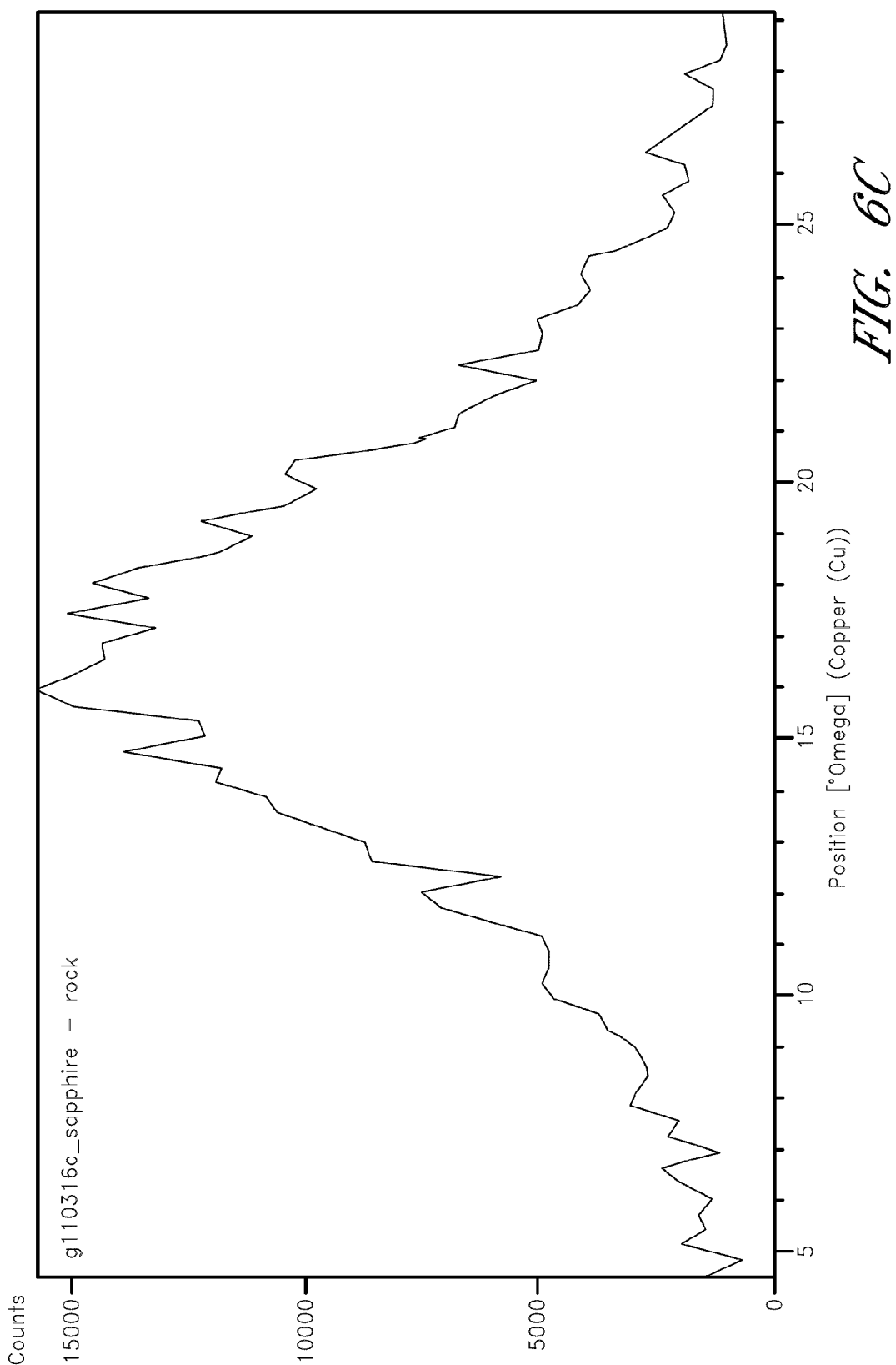
FIG. 6C is a glancing incidence x-ray diffraction (GIXRD) graph of a InGaN film deposited on sapphire in accordance with one embodiment.

FIGS. 6A-6C show glancing incidence x-ray diffraction (GIXRD) graphs for various 2θ values. FIG. 6A is an InGaN thin film deposited on sapphire. The largest peak in FIG. 6A corresponds to the (006) peak of sapphire with a smaller (002) peak. FIG. 6B is a GaN thin film deposited on sapphire. The largest peak in FIG. 6B corresponds to the (006) peak of sapphire with a smaller (002) peak. FIG. 6C shows a portion of the GIXRD data from 6A. The rocking curve of (002) has a FWHM (Full Width at Half Maximum) of 8.3° on sapphire.

Example 6

Figure 7:
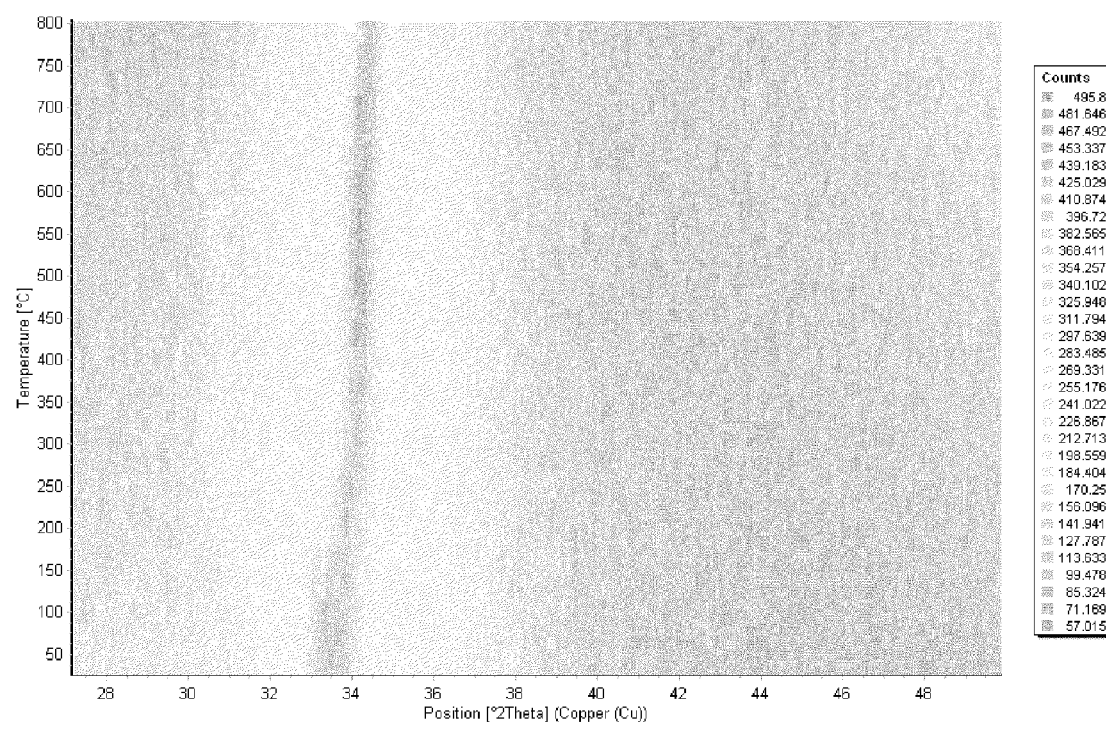
FIG. 7 is an x-ray diffraction graph of a InGaN film deposited on sapphire heat treated at various temperatures in accordance with one embodiment.

FIG. 7 shows temperature versus 2θ values with brighter/lighter areas indicating increased counts for the x-ray diffraction pattern. The peak value was around 33-34.6°, with increased temperature shifting the peak closer to the expected 34.6° value for GaN (002).

Example 7

InN thin films were deposited using trimethylindium (TMI) and $NH_3$-plasma as precursors. The substrate temperature was 200° C. during the film deposition. The deposition resulted in 0.5 Å/cycle growth rate and a refractive index of 1.9-2.0 in the deposited film. The cycle time was 6 seconds. 400 W plasma power was used and 50 sccm $NH_3$ flow was used during the plasma exposure.

Example 8

AlN thin films were deposited using an AlN cycle including trimethylaluminum (TMA) and $NH_3$-plasma. The substrate temperature was at room temperature i.e. about 20° C. during the film deposition. The film grew at a high rate, approximately 2.0 Å/cycle. The resulting film had a refractive index of 1.55. The cycle time was 6 seconds.

Example 9

GaN films doped with uniformly controlled amount of In are deposited from $GaCl_3$, trimethylindium (TMI) and $NH_3$ or N/H-plasma. In the specific pulsing sequence first $GaCl_3$ is pulsed to the reaction space where it contacts the substrate surface. Typically $GaCl_3$ will react with the OH— or NHx-groups on the surface, but will not react with bridge-type of structures, for example, with siloxane bridges —Si—O—Si—. Excess reactant is then removed with a purge step. Third, trimethylindium is pulsed to the reaction space, where it contacts the substrate surface and reacts with the remaining reactive sites that did not react with the $GaCl_3$ pulse. Next, another purging step is applied. Following the purge step to remove excess trimethylindium, a $NH_3$ or N/H-plasma is reacted with the substrate surface that comprises chemisorbed GaClx-species and TMI-species. Following the plasma pulse, a final purge step is applied. Thus, a full cycle of In-doped GaN is formed. This cycle is repeated as many times as needed to obtain a film of the desired thickness. In some embodiments the indium reactant may be provided before the Ga reactant in the deposition cycle. Deposition of the In doped GaN film may be followed by bulk GaN deposition, if desired.

Example 10

GaN films doped with a uniformly controlled amount of Mg are deposited on a substrate from $GaI_3$, bis(cyclopentadienyl)magnesium $Mg(Cp)_2$ and $NH_3$ or N/H-plasma. In a specific pulsing sequence, $GaI_3$ is first pulsed into the reaction space to contact the substrate surface. Secondly a purging step is used to remove excess first reactant. Third, $Mg(Cp)_2$ is pulsed into the reaction chamber and contacts the substrate surface, such that it reacts with the remaining reactive sites that were not reactive towards $GaCl_3$. Fourth, another purging step is applied to remove excess magnesium reactant. Fifth, a $NH_3$ or N/H-plasma is reacted with the substrate surface on which both $GaCl_x$-species and $Mg(Cp)_2$-species are chemisorbed. Sixth, a further purg step is applied. Thus, a full cycle of Mg-doped GaN is formed. This cycle is repeated as many times as needed to get desired thickness. Bulk deposition of GaN may follow deposition of the Mg-doped GaN film, if desired.

In some cases the $Mg(Cp)_2$ may be provided as the first reactant and $GaI_3$ as the second reactant. In that case more Mg is left to the film in each cycle. The dopant concentration in the whole film can be controlled by inserting these specific doping cycles between normal GaN deposition cycles.

It will be appreciated by those skilled in the art that various modifications and changes can be made without departing from the scope of the invention. Similar other modifications and changes are intended to fall within the scope of the invention, as defined by the appended claims.

We claim:

1. A method for depositing a thin film comprising GaN on a substrate in a reaction space by an atomic layer deposition process comprising a plurality of deposition cycles, each deposition cycle comprising:
   contacting the substrate with a Ga precursor such that no more than a single monolayer of the Ga precursor adsorbs on the substrate surface in a self-limiting manner; and
   contacting the substrate with a nitrogen precursor, such that the nitrogen precursor reacts with the adsorbed Ga precursor to form GaN, wherein the reaction space is part of a flow-type reactor.

2. The method of claim 1, wherein the deposited film is epitaxial or single-crystal film.

3. The method of claim 1, wherein the GaN is deposited at a growth rate of less than 1.5 Å/deposition cycle.

4. The method of claim 1, wherein the GaN is deposited at a growth rate of less than 0.3 Å/deposition cycle.

5. The method of claim 1, wherein the deposition cycle additionally comprises contacting the substrate with a plasma pulse to provide heat for crystallization.

6. The method of claim 1, wherein the Ga precursor is an organic Ga compound.

7. The method of claim 1, wherein the Ga precursor is a Ga halide.

8. The method of claim 1, wherein the nitrogen precursor does not comprise an activated compound.

9. The method of claim 1, wherein the nitrogen precursor comprises nitrogen plasma.

10. The method of claim 1, wherein the nitrogen precursor is selected from $NH_3$ and $N_2H_4$.

11. An atomic layer deposition (ALD) process for forming a GaN containing thin film on a substrate in a reaction chamber comprising a plurality of deposition cycles, each cycle comprising:
   providing a pulse of a first vapor phase Ga halide reactant into the reaction chamber to form no more than about a single molecular layer of the first reactant on the substrate;
   removing excess first reactant from the reaction chamber;
   providing a pulse of a second vapor phase nitrogen reactant to the reaction chamber such that the second vapor phase reactant reacts with the first reactant on the substrate to form a GaN containing thin film, and
   removing excess second reactant and reaction byproducts, if any, from the reaction chamber.

12. The method of claim 11, wherein the Ga halide reactant is $GaCl_3$, $GaCl$, or $GaI_3$.

13. The method of claim 11, wherein the nitrogen reactant is $NH_3$ or $N_2H_4$.

14. The method of claim 11, wherein the GaN thin film is deposited at a temperature below 700° C.

15. The method of claim 11, wherein the reaction chamber is part of a flow-type reactor.

16. The method of claim 11, wherein the deposited GaN film is epitaxial or single-crystal film.

17. The method of claim 11, wherein the nitrogen reactant comprises nitrogen plasma.

18. The method of claim 17, wherein the nitrogen plasma is formed in situ.

19. The method of claim 17, wherein the nitrogen plasma is formed remotely.

20. The method of claim 17, wherein the nitrogen plasma does not have substantial amount of N ions when it contacts the substrate.

21. The method of claim 17, wherein the second reactant further comprises hydrogen plasma.

22. The method of claim 17, wherein the GaN thin film is deposited at a temperature below 200° C.

23. The method of claim 11, wherein the reaction chamber is part of a flow-type reactor.

24. The method of claim 11, wherein the deposited GaN film is epitaxial or single-crystal film.

25. An atomic layer deposition (ALD) process for forming a GaN containing thin film on a substrate in a reaction chamber comprising a plurality of deposition cycles, each cycle comprising:
   providing a pulse of a first organic Ga precursor into the reaction chamber to form no more than about a single molecular layer of the first reactant on the substrate;
   removing excess first reactant from the reaction chamber;
   providing a pulse of a second reactant vapor phase nitrogen reactant to the reaction chamber such that the second reactant reacts with the first reactant on the substrate to form a GaN containing thin film, and
   removing excess second reactant and reaction byproducts, if any, from the reaction chamber.

26. The method of claim 25, wherein the organic Ga precursor is trimethylgallium (TMG) or triethylgallium (TEG).

27. The method of claim 25, wherein the organic Ga precursor has a formula $GaR_3$, wherein the R is selected from substituted, branched, linear or cyclic C1-C10 hydrocarbons.

28. The method of claim 25, wherein the second reactant comprises N plasma.

29. The method of claim 28, wherein the second reactant further comprises hydrogen plasma.

30. The method of claim 25, wherein the nitrogen reactant is $NH_3$ or $N_2H_4$.

31. The method of claim 25, wherein the GaN thin film is deposited at a temperature below 400° C.

32. The method of claim 25, wherein the GaN thin film is deposited at a temperature below 200° C.

33. The method of claim 25, wherein the reaction chamber is part of a flow-type reactor.

34. A method for depositing a thin film comprising InGaN on a substrate in a reaction space by an atomic layer deposition process comprising a plurality of first deposition cycles for depositing GaN and a plurality of second deposition cycles for depositing InN,
   each GaN deposition cycle comprising:
   contacting the substrate with a Ga precursor such that no more than a single monolayer of the Ga precursor adsorbs on the substrate surface in a self-limiting manner; and
   contacting the substrate with a nitrogen precursor, such that the nitrogen precursor reacts with the adsorbed Ga precursor to form GaN, wherein the reaction space is part of a flow-type reactor, and
   each InN deposition cycle comprising:
   contacting the substrate with a In precursor such that no more than a single monolayer of the In precursor adsorbs on the substrate surface in a self-limiting manner; and
   contacting the substrate with a nitrogen precursor, such that the nitrogen precursor reacts with the adsorbed In precursor to form InN,
   wherein the reaction space is part of a flow-type reactor.

35. The method of claim 34, wherein the InGaN film is an epitaxial or single-crystal film.

\* \* \* \* \*